United States Patent [19]

Tancredi

[11] 4,387,000
[45] Jun. 7, 1983

[54] LAMINATING ROLL ACTUATING CRANK MECHANISM

[75] Inventor: Henry J. Tancredi, Gwynedd, Pa.

[73] Assignee: E. I. Du Pont de Nemours and Company, Wilmington, Del.

[21] Appl. No.: 235,412

[22] Filed: Feb. 17, 1981

[51] Int. Cl.³ .................... B32B 31/00; B30B 3/04
[52] U.S. Cl. ............................ 156/495; 156/555; 100/170; 100/176; 425/363
[58] Field of Search ............... 156/494, 495, 555; 100/155 R, 170, 176; 425/363

[56] References Cited

U.S. PATENT DOCUMENTS

| | | | |
|---|---|---|---|
| 3,767,510 | 10/1973 | Gustatson | 156/494 |
| 4,050,803 | 9/1977 | McCarroll | 100/176 |
| 4,135,962 | 1/1979 | Sinclair | 156/555 |
| 4,243,464 | 1/1981 | Potchen et al. | 156/555 X |

Primary Examiner—Edward C. Kimlin
Assistant Examiner—Lois E. Boland

[57] ABSTRACT

A pair of laminating rolls are respectively connected to a first and a second actuating arm themselves pivotally mounted to a slotted actuating link. The link is itself pivotally mounted to a single actuator. The link is arranged such that opening and closing forces are simultaneously applied to the arms to open and close the laminating rolls.

3 Claims, 9 Drawing Figures

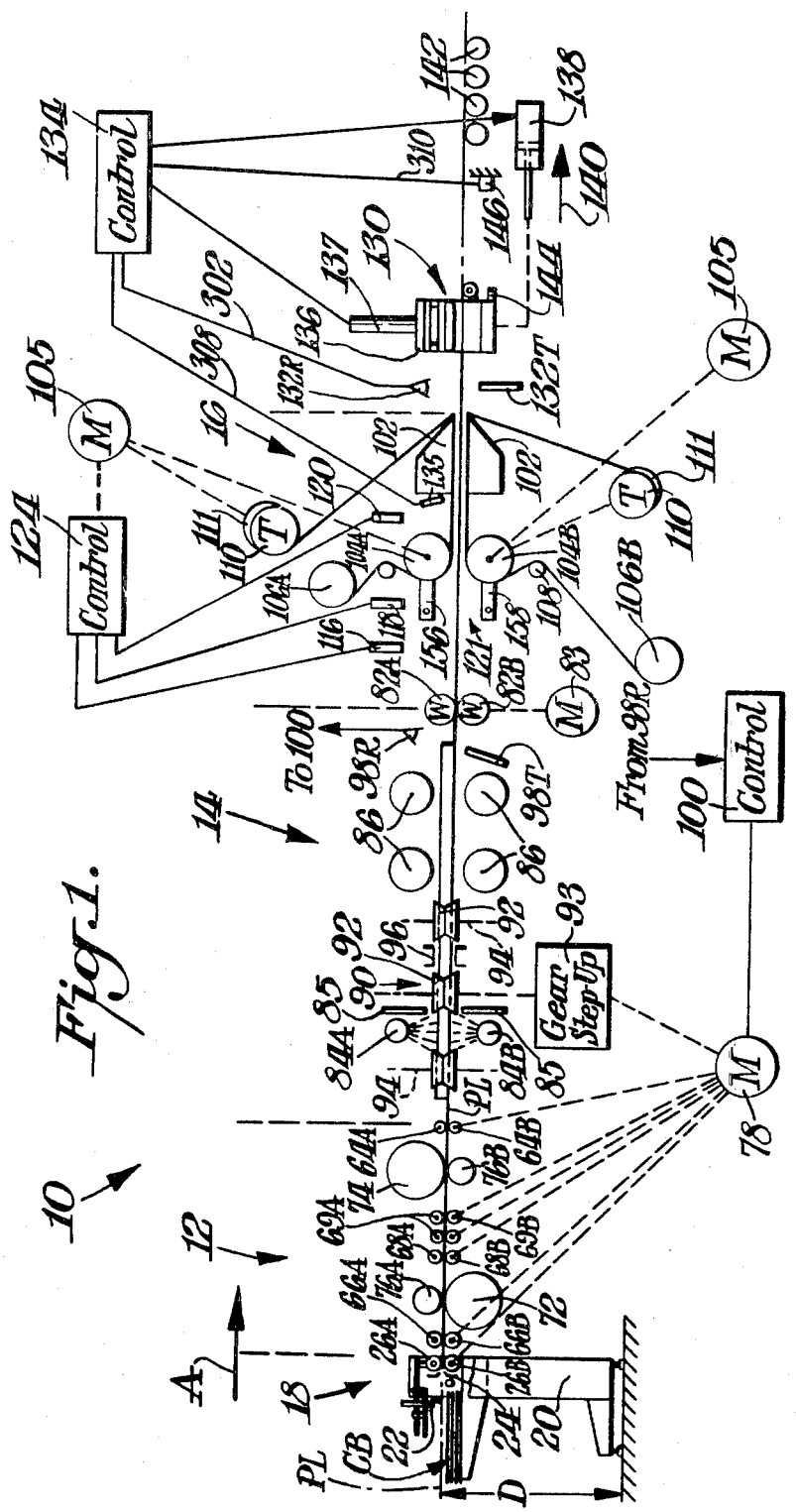

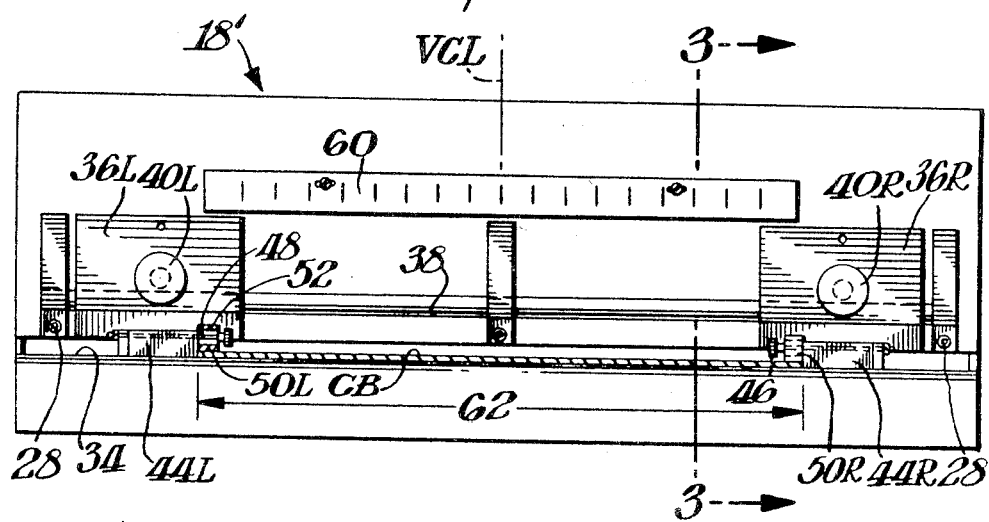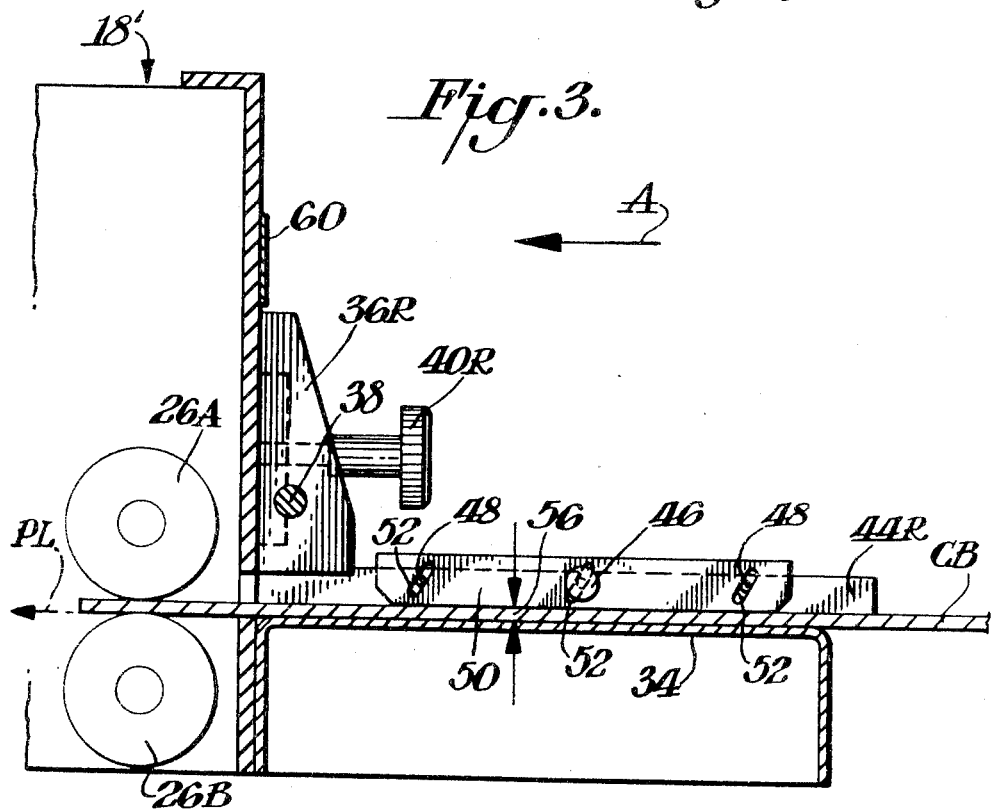

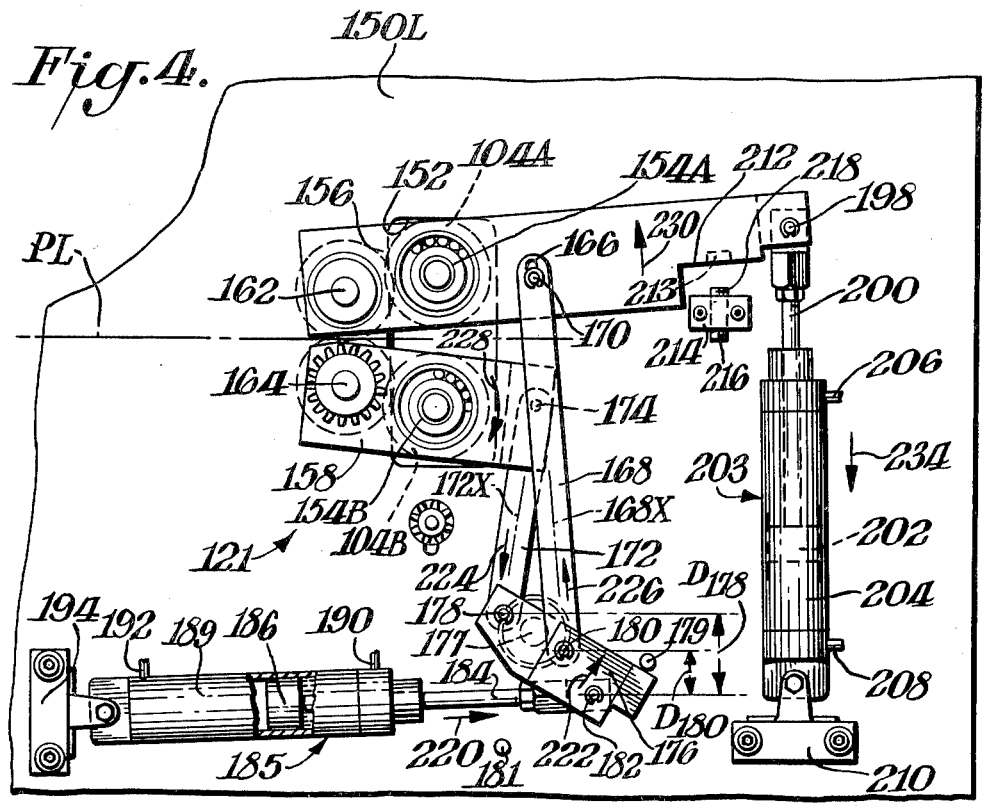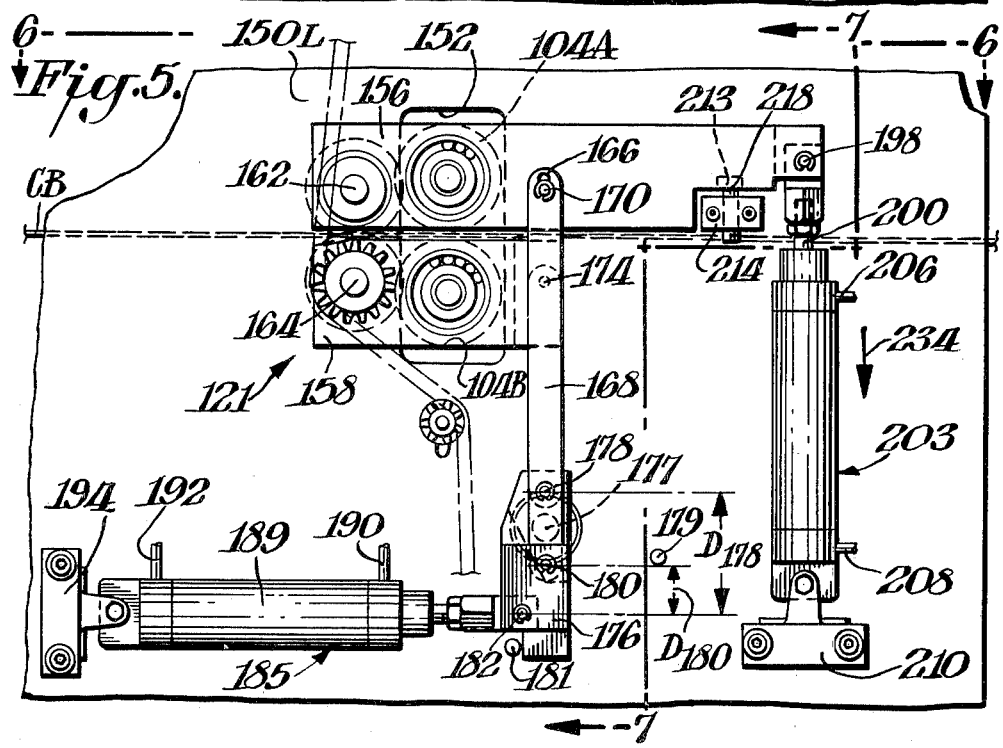

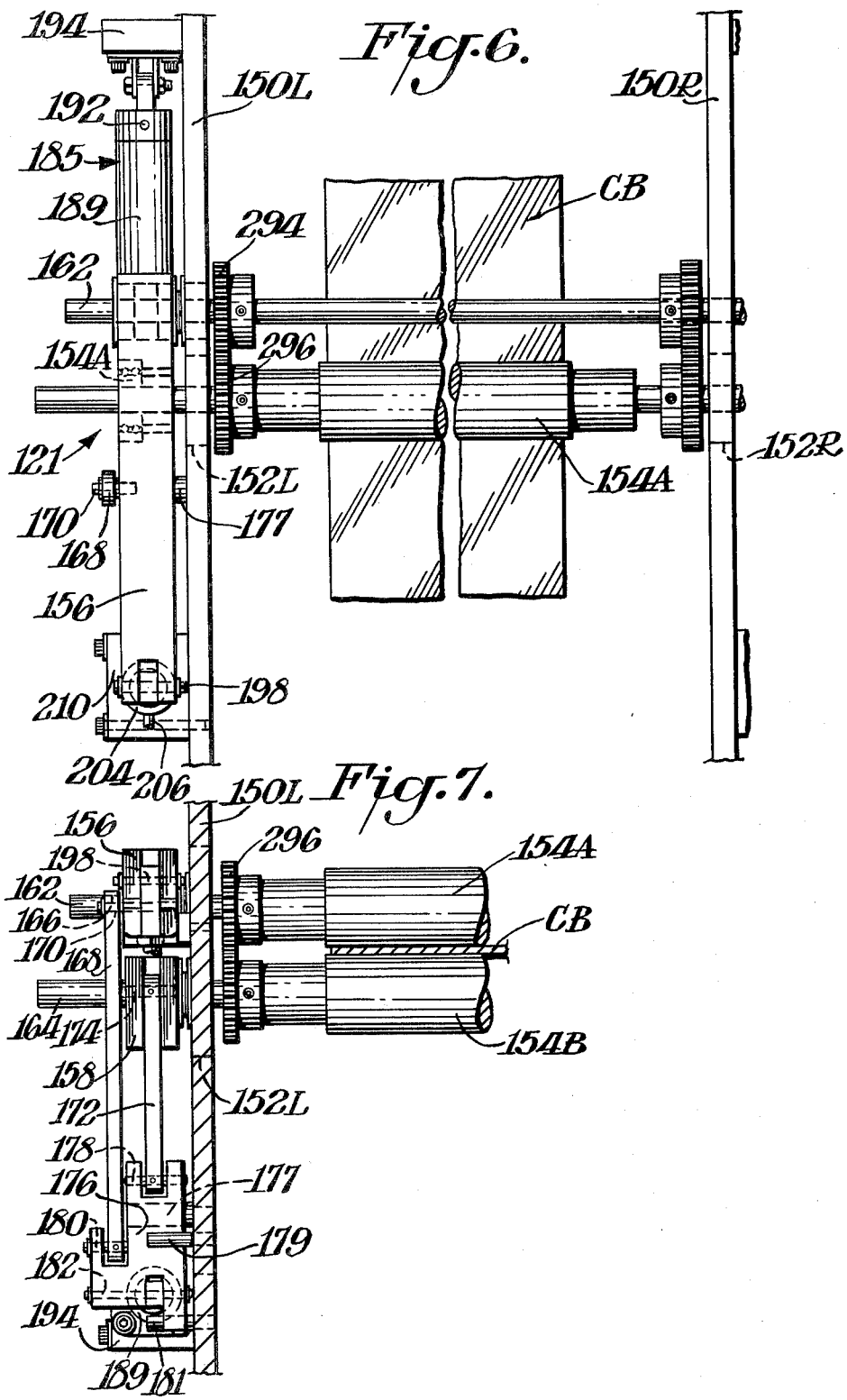

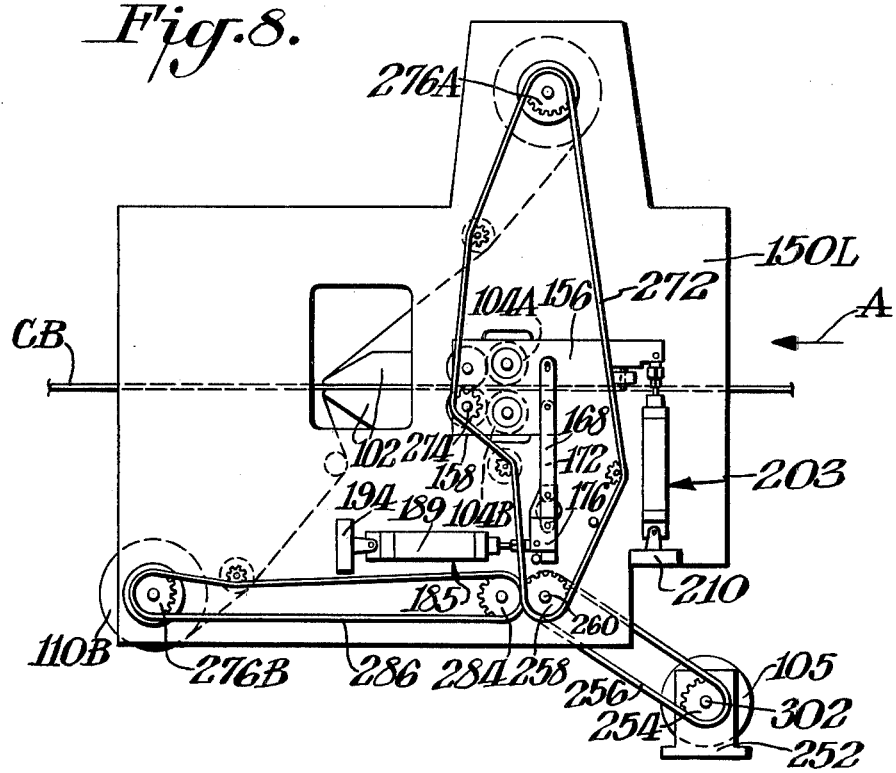
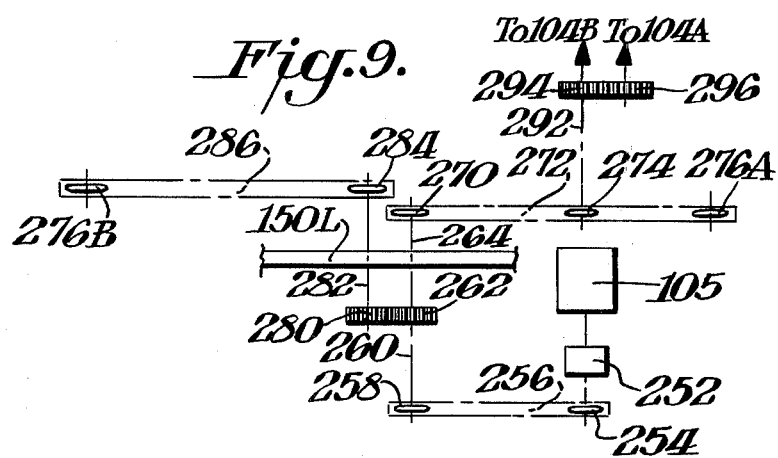

LAMINATING ROLL ACTUATING CRANK MECHANISM

FIELD OF THE INVENTION

This invention relates to an apparatus for automatically laminating printed circuit boards with a dry film photopolymer resist material and, in particular, to an actuating crank mechanism for bringing together the laminating rolls in the apparatus.

BACKGROUND ART

When using a dry film photopolymer resist material, such as that manufactured by E. I. du Pont de Nemours and Company, Inc. and sold under the trademark RISTON ®, it is necessary to laminate a layer of that material onto the surface of a circuit board or other substrate prefatory to exposure by actinic radiation. Typically, the layer of photopolymer resist material is laid over the surface of the substrate to be covered and the substrate and resist passed between the nip of heated laminating rolls. The surface of the substrate may be previously scrubbed to remove oxide layers and other contaminants therefrom. The scrubbing assists in the adhesion of the resist material to the substrate. If done manually, the preparation of the substrate and the introduction and removal thereof into and from the laminating rolls is time consuming and expensive.

It is advantageous to increase the throughput of the laminating operation by providing an apparatus adapted to automatically prepare the surface of the substrate, convey the prepared substrate to the lamination region which contains the heated laminating rolls, and thereafter remove laminated boards from the apparatus for further fabrication. However, in any automated apparatus certain minimum requirements are believed necessary in order to most efficiently and effectively laminate a resist layer to the surface of a substrate.

For example, if copper coated boards are to be laminated with a resist material, it is believed to be advantageous to utilize a conveyance arrangement which expeditiously translates the board from the region in which the surface thereof is scrubbed to the region in which the board is laminated in order to minimize the oxidation of the surface of the substrate to the fullest extent possible.

To avoid wastage of resist material, it is also desirable that individual boards be presented to the laminating rolls with as little a gap as possible between a given board and a trailing board. Thus, any coveyance arrangement should be adapted to avoid cumulative gapping between successive boards introduced into the lamination region. It is believed to be most desirable to provide a conveyance arrangement wherein successive boards are in an abutted relationship (tail-to-head) at the time one of the boards is introduced into the laminating rolls. Moreover, any conveyance arrangement should be able to maintain abutment between successive boards without regard to variations in board length from run to run. Since the boards being laminated are relatively thin planar members, it is also necessary that any conveyance arrangement be adapted to prevent board overlap. That is, the leading edge of a trailing board must not extend over or under the trailing edge of a leading board. Such an occurrence can potentially render inutile both boards.

In the lamination region itself, it is believed desirable to provide a mechanism whereby the laminating rolls are accurately brought into contact with the leading edge of a leading board in a run and (assuming the boards are butted) removed from contact as the trailing edge of the last trailing board exits the laminating rolls. Such a practice is advantageous in that it avoids wastage of resist material. Moreover, the laminating rolls should be susceptible to accurate opening and closing motions which would bring the rollers into contact with the surfaces of the board and predictably impart a predetermined pressure force to the board to laminate the resist layer thereto. The gap, or nip, formed between the rollers when the rollers are closed should, moreover, be predictably adjustable.

Once the board and resist material have been laminated, the laminate (i.e., substrate and resist layer adhered thereto) so formed should be automatically removable from the apparatus. With those resist materials which are provided with a backing strip the laminate may be moved through the apparatus incidentally to the take-up of the backing strip. When the backing strip is being taken-up, care must be exercised that proper tension is maintained on the strip. It is therefore believed advantageous to provide a slip clutch tension device to insure that the take-up tension force exerted by a take-up roller on the backing strip be held within appropriate limits.

While any portion of the laminate is still within the apparatus the laminate is subjected to a restraining force which tends to resist any displacing force imposed on the laminate to assist in its withdrawal from the apparatus. However, when laminate is drawn through the automated apparatus it is desirable to provide a structural arrangement whereby the laminate is separated from the backing strip and any unadhered resist present between the trailing edge of the laminate and the leading edge of the next-successive laminate. Accordingly, it is believed advantageous to provide a gripping arrangement adapted to grasp the laminate when a predetermined portion thereof has exited from the apparatus and to exert a force on the laminate which pulls it free from the trailing resist material when the backing strip is completely removed from the laminate.

SUMMARY OF THE INVENTION

The instant invention relates to a crank mechanism for opening and closing a pair of laminating rolls in an apparatus for automatically laminating a photopolymer resist material to the surface of a circuit board. The laminating rolls are each supported at a corresponding end by a first and second support arm, respectively. Each support arm is pivotally mounted at corresponding ends thereof to a fixed member. The crank mechanism of the instant invention comprises a first and a second force transmission bar respectively pivotally connected to the first and second support arms and to a stepped actuating link at distinct pivot points. A single actuator is pivotally connected to the actuating link at a distinct third pivot point, the actuator being adapted to rotationally displace the link from a first position in which axes of the transmission bars are parallel to a second position in which the axes of the transmission bars intersect. The link is responsive to a force imposed thereon by the actuator acting in a first direction to simultaneously transmit through the force transmission bars a force on each arm tending to displace the rolls away from the position occupied relative to each other while the link is in the first position. The link is also responsive to a second force directed oppositely to the first force to simultaneously transmit through the force transmission bars a force on each arm tending to restore the rolls to the relative position occupied while the link is in the first position.

The crank mechanism also includes a second actuator pivotally connected to one of the control arms at a point thereon physically separated from the point at which the control arm pivots with respect to the fixed member for imposing a pressure force on the rolls while the axes of the transmission bars are in a parallel orientation. The crank mechanism further includes an adjustable stop for limiting the magnitude of the force imposed on the selected control arm by the second actuator.

BRIEF DESCRIPTION OF THE DRAWINGS

The invention will be more fully understood from the following detailed description thereof taken in connection with the accompanying drawings which form a part of this application and in which:

FIG. 1 is a stylized schematic representation of an apparatus for automatically laminating a circuit board with which the instant invention is utilized;

FIGS. 2 and 3 are a front elevation view and a side section view, respectively, of an alternate in-feed arrangement;

FIGS. 4 and 5 are side elevation views of a crank mechanism for laminating rolls in accordance with this invention shown in a first, open, and a second, closed, position, respectively;

FIGS. 6 and 7 are, respectively, views of the laminating section of an automated laminating apparatus and of the crank mechanism taken along lines 6—6 and 7—7 of FIG. 5; and FIGS. 8 and 9 are, respectively, a side elevation view and a schematic diagram of the laminating roll and take-up roll drive connections.

DETAILED DESCRIPTION OF THE INVENTION

Throughout the following detailed description similar reference numerals refer to similar elements in all Figures of the drawings.

FIG. 1 is a highly stylized schematic representation of an apparatus 10 for automatically laminating individual circuit boards CB with a dry film photopolymer resist material such as that sold by E. I. du Pont de Nemours and Company, Inc. under the trademark RISTON ®. The individual circuit boards CB able to be handled by the apparatus 10 in accordance with this invention are typically planar members having planar width dimensions ranging from twelve to eighteen inches and planar length dimensions ranging from fourteen to twenty-four inches. Individual circuit boards CB may have a thickness dimension in a range from 0.030 inches to 0.125 inches. The boards CB form the substrate upon which a layer of the resist material may be laminated to the upper surface, the lower surface or both surfaces of the board CB. The boards CB may be fabricated of a single copper plate or may themselves be laminates of several intermediate plates (commonly called "inner layers") with the upper and lower surfaces of the boards CB being copper.

The apparatus 10 is an integrated device which is able to perform each of the functions necessary to prepare an individual circuit board CB for the application of a dry film photopolymer resist material and to apply the resist material thereto. The apparatus 10 includes a brush cleaning region 12 (hereafter the "cleaning section"), a rinse and air-dry region 14 (hereafter the "rinsing section"), and a lamination region 16 (hereafter the "laminating section"). Individual circuit boards CB are introduced into the cleaning section 12 of the apparatus 10 by an in-feed arrangement 18.

The in-feed arrangement 18 includes a frame 20 having a pneumatic carrying element 22 mounted thereon. Individual circuit boards CB are lifted from a supply of boards and carried by the carrying element 22 to a lead-in guide 24 terminating at the nip of an inlet pair of nip rollers 26 disposed at the inlet of the cleaning section 12.

Alternatively, individual circuit boards CB may be manually fed into the apparatus 10 through an in-feed arrangement 18' shown in FIGS. 2 and 3. The in-feed arrangement 18' is attachable to the front of the apparatus 10 by any suitable means, as by screws 28. The in-feed arrangement 18' includes a planar tray 34 having laterally adjustable guides 36L and 36R movably disposed along a fixed guide shaft 38. The guides 36 are supportable in a fixed location along the shaft 38 by lock nuts 40. Each guide 36 includes a forwardly projecting arm 44 having a lug 46 and guide pins 48 extending therefrom in a confrontational relationship with the lug 46 and the pins 48 on the opposite arm 44. A runner 50 having inclined slots 52 therein is received on the lug 48 and guide pins 50 extending from each of the arms 44. The runners 50 slide in the slots 52 with respect to the lug 46 and pins 48 to increase or decrease the vertical dimension 56 of an in-feed slot defined between the lower surface of the runners 50 and the upper surface of the planar tray 34. By limiting the vertical dimension 56 of the in-feed slot it is possible for an operator to insert only a single board CB into the apparatus 10 at any given time. Because of the thickness limitation of the in-feed slot, circuit boards CB may only be serially introduced into the inlet nip rollers 26 of the apparatus 10, thus preventing overlap of boards.

The spacing 62 defined between the confronting portions of the arms 44 serves to channelize the circuit boards CB into a path of travel symmetrical about the vertical centerline VCL extending through the apparatus 10. The transverse dimension of the spacing 62 between the arms 44 is indicated by an indicia 60. The transverse dimension of the path of travel is adjustable to correspond to the planar width dimension of the boards CB being laminated. The individual circuit boards CB are conveyed through the apparatus 10 along a pass line PL (FIG. 1). The pass line PL is an imaginary horizontal line extending from the inlet to the outlet of the apparatus along which the lower surface of a board CB is conveyed as the board moves through the various regions of the apparatus. The pass line PL may be defined as a line extending through the apparatus 10 that lies a predetermined fixed distance D from a predetermined reference datum, as the floor of the workspace on which the apparatus is disposed. Hereafter, the pass line PL shall serve as a vertical reference datum for locating structural elements within the apparatus 10 as being either thereabove or therebelow. The vertical centerline VCL through the apparatus 10 shall serve a horizontal reference datum for locating structural elements as being either right or left as viewed from the in-feed end of the apparatus 10 (FIG. 2). Circuit boards CB are conveyed along the pass line PL in a path of travel in the direction of arrow A (FIG. 1) extending from the in-feed end of the apparatus, through the cleaning section 12, the rinsing section 14, to the outlet of the laminating section 16.

The cleaning section 12 is defined between the inlet pair of nip rollers 26A and 26B (respectively above and below the pass line PL) and a second, outlet, pair of nip rollers 64A and 64B. Intermediate pairs of nip rollers 66A and 66B, 68A and 68B and 69A and 69B are disposed within the cleaning section 12 and cooperate with the rollers 26 and 64 to define a conveyor by which circuit boards CB are transported through the cleaning section 12 along the pass line PL. Intermediate between the nip rollers 66 and 68 is a lower surface brush scrubber 72 while an upper surface brush scrubber 74 is disposed between the nip rollers 64 and 69. The brush scrubber 72 is located below the pass line PL while the brush scrubber 74 is disposed above the pass line PL. Each scrubber acts against an associated backup roller 76A and 76B, respectively. The nip rollers 26, 64, 66, 68 and 69 are driven by a drive motor 78 appropriately geared such that circuit boards CB are passed through the cleaning section 12 at a first predetermined linear speed (typically eight linear feet per minute). It is at this speed that boards CB exiting the cleaning section 12 enter the adjacent rinsing section 14 through the nip rollers 64A and 64B. In the cleaning section 12 the abrasive action of the nylon bristle brushes with silica carbide inserts on the scrubbers 72 and 74 respectively remove oxide and a thin layer of material from both the lower and upper surfaces of the board CB. The scrubbers 72 and 74 are rotated by a drive motor (not shown) and are also movable with respect to the vertical center line VCL of the apparatus 10. This transverse motion of the brush scrubbers assists their removal of the thin layer of material from the surface of the circuit board CB. Suitable for use as the cleaning section 12 is a Surface Finisher sold by Chemcut, Inc. of State College, Pa. under Model No. 107. Of course any other suitable surface cleaner may be utilized.

Between the pair of nip rollers 64 at the exit of the cleaning section 12 and a pair of wetting rolls 82 lies the rinsing section 14. In this section the now-scrubbed surfaces of the circuit boards CB are rinsed by the application of a water spray from nozzles 84A and 84B arranged above and below the pass line PL, respectively. Suitable baffles 85 are provided to prevent water from leaving the portion of the rinsing section in the vicinity of the nozzles 84. The boards CB are air dried by streams of air directed theretoward from an array 86 of air knives. The rinsing and air-dry procedure removes copper fines and other extraneous matter from the scrubbed surfaces of the boards preparatory to the introduction of the boards to the laminating section 16.

The wetting rolls 82 contain an inner core formed of a hollow stainless steel rod having radially extending slots therethrough. Wetting solution is introduced to the interior of the core through rotary unions which also act as trunnions to support the wetting rolls 82 in the frame of the apparatus 10. Disposed around the exterior of the core is an outer layer of porous polyethylene. This layer is covered by a fabric sock outer covering. The polyethylene layer and outer fabric sock meter the wetting solution onto the surface of the boards. The wetting rolls 82 are connected to a drive motor 83 and are preferably driven at the same linear speed as nip rollers 64.

The boards CB are conveyed through the rinsing section 14 by a conveyance arrangement including a V-roller drive 90. The V-roller drive includes an array of roller elements 92 which rotate on axes 94 perpendicular to the pass line PL. The rollers 92 have a peripheral slot therein which receives the lateral edges of each board CB and guides the edges of the boards CB into contact with a driving surface disposed at the base of the slot. The driving surface defines a predetermined friction angle with the axis 94 of the roller. The rollers 92 drive each circuit board CB from the nips 64 to the wetting rolls 82. The V-roller drive 90 translates an otherwise unrestrained board CB at a speed greater than the linear speed at which the board is driven while under the influence of either the nip rollers 64 or the wetting rolls 82. However, whenever a board is restrained (by either the nip rollers 64 or otherwise) the same friction angle allows the rollers 92 to slip against the edge of the board. The V-rollers 92 in the V-roller drive are driven by a geared interconnection 93 with the motor drive 78 at a velocity greater than the velocity at which the nip rollers 64 are driven.

The V-roller drive 90 translates boards from the exit of the nip rollers 64 into abutting relationship with the trailing edge of a preceding board already engaged in the wetting rolls 82. Board overlap is prevented by the vertical dimension of the peripheral slot in the rollers 92 and by horizontally disposed plates 96 arranged to form slots which register with the slots in the rollers 92. The slots in the rollers 92 and those formed by the plates 96 (which engage the edges of the boards in the regions between V-rollers 92) prevent the occurrence of board overlap. A detector arrangement 98 is located upstream of the wetting rolls 82 to detect gaps between boards entering the wetting rolls 82. A gap (or nonabutting relationship) between boards is detected by the detector 98 and a signal generated thereby is applied to a motor control network 100 which results in an increased speed of rotation of the V-rollers 92 and also an increased speed of boards through the cleaning section 12. As a further result of the increase of board speed, there is an increase in the rate at which circuit boards CB are fed by the in-feed arrangement 18 (or an operator if the manual in-feed 18' is used) to the apparatus 10.

Still with reference to FIG. 1 the laminating section 16 is disposed between the wetting rolls 82 and the nose of wedges 102. In the laminating section 16 the upper and lower surfaces of the circuit board CB are provided with a layer of dry film photopolymer resist through the action of a pair of laminating rolls 104A and 104B. The laminating rolls 104 are driven by a motor 105.

A supply of photopolymer resist material for the upper and lower surfaces of the circuit boards is respectively stored on supply rolls 106A and 106B. The photopolymer resist material includes a web or film of the resist material itself supported on a substrate or backup strip of any suitable material. From the supply rolls 106 the resist material is trained over guide rolls 108 and into the gap between the laminating rolls 104. It is between the laminating rolls 104 that the film resist is adhered by the application of heat and pressure to the surface of the circuit board. The backup strip, now forming the outer layers of a sandwich which includes a laminate (formed of the circuit board and the resist material adhered thereto) extends through the apparatus 10 to and through the wedges 102. At the nose of the wedges 102 the backup strip diverges sharply and is peeled away from the resist material, leaving the laminated sandwich of the board having upper and lower layers of photopolymer resist material thereon.

The backup strip is taken-up by take-up rolls 110 each having a continuously slipping clutch tension device 111 associated therewith. The drive sprockets for the laminating rolls 104 and for the take-up rolls 110 are driven by the same motor 105. Due to a difference in the size of the drive sprockets, the speed of the drive sprocket for the take-up rolls 110 is greater than the speed of the drive sprocket for the laminating rolls 104. However, due to the provision of the continuously slipping clutch tensioning device 111, the mandrel of each of the take-up rolls is rotated at a lesser angular speed, thus controlling the tension force applied to the backup strip by the rolls 110.

An array of sensors 116, 118, and 120 are disposed at predetermined locations in the laminating section 16. Each sensor 98, 116, 118 and 120 comprise a phototransmitter T and a photoreceiver R pair. In operation, the phototransmitter T is disposed below the pass line PL, facing upwardly, while the photoreceiver R is disposed above the pass line PL facing downwardly. The first sensor 116 is arranged to generate a signal to a control arrangement 124 when the leading edge of the first circuit board in the train of boards passing the sensor 116. This signal initiates operation of the drive motor 105 which drives the laminating rolls 104 and the take-up rolls 110. A signal from the second sensor 118 that the leading end of the first circuit board is moving therepast initiates the closing of the laminating rolls 104. The laminating rolls 104 close just as the leading edge of the first board enters the nip thereof. When the trailing edge of the last board passes the sensor 120 a signal is generated thereby representative of that fact and the laminating rolls 104 are opened. For clarity of illustration, only the photoreceivers R for the sensors 116, 118 and 120 are shown in FIG. 1.

A crank mechanism diagrammatically indicated at 121 facilitates the opening and closing of the laminating rolls 104. The detailed description of crank mechanism 121 is set forth herein.

As noted earlier the now-laminated circuit board (or "laminate") is advanced through the laminating section 16 downstream of the laminating rolls by the action of the take-up rolls 110. The take-up action of the rolls 110 draws the laminate through the pair of wedges 102 and at the wedges the backup strip diverges sharply toward the take-up rolls 110 and is thereby removed from the surface of the film which has been heat-laminated to the board. While any portion of the laminate is still within the apparatus the laminate is subjected to a restraining force which tends to resist any displacement force imposed on the laminate in the direction of arrow A.

As the laminate begins to emerge from the nose of the wedges 102 a detector 132 arrangement (identical with the detector 98) generates a signal to a control network 134 over a line 302. The speed at which the laminate leaves the wedges 102 is monitored by a shaft encoder 135 arranged proximal to the drive sprocket for the laminating rolls 104 and a signal provided on a line 308 to the control network 134. When a predetermined portion of the board is through the wedges 102, gripping elements 136 which form a part of a gripping arrangement 130 grasp the laminate on opposite sides thereof. Simultaneously a cylinder 138, also part of the gripping arrangement 130, is activated which applies a force acting in the directon 140 (parallel to the arrow A) drawing the gripping elements 136 and the laminate grasped thereby away from the wedges 102. However, so long as the laminate is engaged between the wedges 102 the displacement force exerted by the actuator 138 is insufficient to dislodge the laminate from the interior of the apparatus. Once the trailing edge of the laminate clears the wedges 102 the force exerted by the actuator 138 becomes dominant and the laminate jerks in the direction 140 and the laminate is lead onto rollers 142. Upon the imposition of an impulse force the resist severs along a tear line substantially coextensive with the trailing edge of the laminate.

The carriage on which the gripping elements 136 are carried includes a magnet 144. A magnetic sensor switch 146 responds to the proximity of the magnet 144 thereto and provides a signal on a line 310 to the control network 134 that indicates that the gripping elements 136 have reached the end of travel. At the occurrence of the signal the gripping elements 136 release their grasp on the laminate and the actuator 138 is energized in an opposite direction returning the gripping elements 136 to their initial position to await the exit of the next successive laminate from the wedges 102. The laminates may now be manually or automatically stacked, or if desired, applied to other process steps.

The automatic laminating apparatus 10 includes the laminating section 16 in which the laminating rolls 104A and 104B are disposed. As seen in FIGS. 4 through 7, the apparatus 10 includes a drive side walls 150L and 150R in which openings or slots 152 are formed. The ends of the laminating rolls 104A and 104B each project beyond the side walls 150L and 150R where they are mounted within crank mechanisms 121 discussed in detail herein. Since the crank mechanisms 121 which mount the ends of the rolls are identical, only the assembly disposed on the side wall 150L (termed the "drive side wall") are discussed herein.

Each end of the rolls 104A and 104B is respectively supported by roller bearing arrangements 154A and 154B for rotation with respect to an upper control arm 156 and a lower control arm 158. The upper control arm 156 is pivotally mounted to the drive side frame 150L at a pivot point 162. The lower control arm 158 is pivotally mounted at a pivot point 164 with respect to the drive side frame 150L. The lower control arm 158 is of a physically shorter length dimension than the length dimension of the upper control arm 156.

The upper control arm 156 is slotted as at 166. The slot 166 is located substantially midway of the length of the upper control arm 156. An upper force transmission bar 168 is pivotally connected through a suitable nut arrangement 170 to the upper control arm 156.

A lower force transmission bar 172 is pivotally mounted at a pivot point 174 disposed adjacent the end of the lower control arm 158. A slotted actuating link 176 (see also, FIG. 7) is pivotally connected to the drive side wall 150L at a pivot point 177. Additionally, the actuating link 176 is pivotally connected at a pivot point 178 to the free end of the lower force transmission bar 172. The actuating link 176 is also connected at a physically distinct pivot point 180 to the free end of the upper force transmission bar 168. Link stops 179 and 181 are mounted to the drive side wall 150L for a purpose discussed herein. The actuating link 176 is mounted at yet a fourth pivot point 182 to the actuating rod 184 associated with a piston 186 of an actuator 185. Suitable for use as the actuator 185 is a device manufactured and sold by Clippard Corporation, Cincinnati, Ohio under the trademark "Minimatic", model number 18-D-2. The piston 186 is disposed within a double acting actuating cylinder 189. Pressurized fluid inlet and relief connections 190 and 192 are connected to the cylinder 189. The cylinder 189 is fixedly provided through suitable brackets 194 to the drive side wall 150.

The upper control bar 156 is pivotally connected at a pivot point 198 disposed at the end of the upper control arm 156 opposite its pivot point 162 to the piston rod 200 connected to the piston 202 of a second actuator 203. Suitable pressure connections 206 and 208 appropriately provide a pressurized fluid and vent connections to the regions within the cylinder 204 on opposite sides of the piston 202. The cylinder 204 is fixedly secured by mounting brackets 210 to the drive side wall 150L. The actuator 203 is identical to the actuator 185.

The upper control arm 156 is provided with a cutaway portion 212. A stop insert 213 is mounted into the arm 156 in the region of the cutaway portion 212. A bracket 214 is fixedly mounted to the drive side frame 150 in the vicinity of the cutaway portion of the upper control arm 156. A threaded stop nut 216 is received by the bracket 214 and abuts as at 218 to the insert 213 mounted into the underside of the cutaway portion 212 of the upper control arm 156.

In operation, with the laminating rolls 104A and 104B in the closed position (FIG. 5) the axes 168X and 172X of the transmission bars 168 and 172, respectively, are parallel to each other and the actuating link 176 is abutted against the stop 181. The piston 186 occupies the extreme left hand position within the cylinder 188. Moreover, the pivot points 177, 178 and 180 are coincident along a line itself coincident with the aligned axes of the transmission bars 168 and 172. With respect to a given fixed datum, as, for example, the axis of the piston rod 184, each of the pivot points 178 and 180 occupy a first position with respect thereto. The positions of the pivot points with respect to the axis of the piston rod 184 are shown by the offset distances $D_{178}$ and $D_{180}$. (The pivot point 182 lies on the fixed datum, the axis of the piston rod 184.)

In order to open the laminating roll 104A and 104B a pressurized fluid is introduced into the region of the cylinder 188 through the pressure connection 192. (The region to the right of the piston 186 is simultaneously vented through the connection 190.) Pressurized fluid in the region to the left of the piston 186 exerts a first force acting in the direction of arrow 220 to urge the actuating link 176 away from the stop 181 in a counterclockwise direction of rotation as indicated by the arrow 222. As a result of the rotation of the actuating link 176 in the direction 222 the force transmission bar 172 is drawn in a downwardly direction indicated by the arrow 224 (causing the distance $D_{178}$ between the pivot point 178 and the axis of the piston rod 184 to decrease). Simultaneously, the force transmission bar 168 is raised in a direction indicated by the arrow 226 (causing the distance $D_{180}$ between the pivot point 180 and the axis of the piston rod 184 to increase). The movement of the transmission bars 172 and 168 in the direction of arrows 222 and 226, respectively, imparts forces on the lower control arm 158 and the upper control arm 156 tending to respectively urge those members in the directions of arrows 228 and 230, thus causing the laminating rolls 104 supported therein to open. It should be noted that the force imposed through the action of a single actuator 185 is simultaneously utilized to open the rolls 104. It is to be appreciated that any suitable actuating device may be used in place of the pressurized fluid actuators shown in the Figures. The rolls and apparatus then occupy the position shown in FIG. 4. Rotation of the actuating link 176 past the position shown in FIG. 4 is precluded by the stop 179.

To restore the laminating rolls to the closed position (FIG. 5) pressurized fluid is admitted through the connection 190 to that region of the actuator 188 disposed to the right of the piston 186. (The region to the left of the piston 186 is simultaneously vented.) A force directed oppositely to the force 220 then rotates the actuating link 176 in a direction opposite to the direction 222.

Simultaneously, forces are applied to the lower control arm 158 and to the upper control arm 156 respectively tending to raise and lower the same. The members thus assume the position shown in FIG. 5 with the axes 168X and 172X of the transmission bars 168 and 172, respectively, being in alignment.

While the rolls 104A and 104B are in the closed position it may be desired to impart an additional pressure force thereto. For this purpose the second actuator 203 is provided. With the rolls 104 in the closed position (FIG. 5) pressurized fluid is admitted above the piston 202 through the pressure fitting 206. (The region below the piston 202 is simultaneously vented through the connection 208.) The introduction of pressurized fluid above the piston 202 displaces the piston in the direction 234 tending to urge the upper laminating roll 104A toward the lower laminating roll 104B. The magnitude of the overload force imposed on the laminating rolls is adjustable through the agency of the threaded lock nut 216. By varying the portion of the nut 216 threadingly engaged within the bracket 214 the point of abutment 218 between the upper end of the lock nut 216 and the insert 213 in the cut out portion 212 of the upper control arm 156 may be adjusted with respect to the drive side wall 150L. Of course, when the laminating rolls 104 are being opened under the control of the single actuator 185, both sides of the piston 202 are vented, thus neutralizing the effect of the second actuator 204 upon the operation of the crank mechanism hereinbefore described.

With reference now to FIGS. 8 and 9, respectively, shown are a side elevation view and a schematic diagram illustrating the drive train for the laminating rolls 104 and the take-up rolls 110. The motor 105 is mounted beneath the apparatus 10 and is connected in a driving relationship through a gear box 252 to a drive sprocket 254. Suitable for use as the motor 105 is that manufactured and sold by Minarik Electric Co., Los Angeles, Calif. under model number 56-CB/504-06-018. Suitable for use as the gear box 252 is that device manufactured and sold by Hub City Division of Safeguard Power Co., Aberdeen, S. Dak. under model number 134. The sprocket 254 is connected by a chain 256 to a drive sprocket 258 (FIG. 9). The sprocket 258 is in turn connected by a shaft 260 to a gear 262. The shaft 264 of the gear 262 extends through the drive side wall 150L where it engages a drive sprocket 270. The drive sprocket 270 is connected through a chain 272 to a sprocket 274 associated with the laminating roll 104B and also to a drive sprocket 276A associated with the take-up roll 110A. The gear 262 is meshed with a second gear 280 (FIG. 9) the shaft 282 of which extends through the drive side wall 150L to a drive sprocket 284. The drive sprocket 284 is connected by a chain 286 to a drive sprocket 276B associated with the lower take-up roll 110B.

The sprocket 274 is connected by a shaft 292 to a gear 294 (FIGS. 6, 7 and 9) fixed to the lower laminating roll 104B. The gear 294 engages a gear 296 which is fixed to the upper laminating roll 104A so as the laminating rolls 104 are opened and closed by the crank mechanism 121 discussed hereinabove, the gears 294 and 296 remain enmeshed, thus permitting the laminating rolls 104 to be driven, if desired, while in either the open or closed positions.

Those skilled in the art, having the benefit of the teachings set forth hereinabove may recognize numerous modifications which may be effected thereto. For example, the relative position of the parts may be inverted in any manner whatsoever yet still utilize of a slotted actuating link in connection with a single actuator to simultaneously effect the opening or closing motion of each of the laminating rolls. However, it is to be understood that these and other modifications are to be construed as lying within the contemplation of this invention the scope of which is defined in the appended claims.

What is claimed is:

1. In a roller arrangement including a first and a second roll, each roll being supported at a corresponding end by a first and a second arm, each arm being pivotally mounted at corresponding ends thereof to a fixed member, the improvement which comprises:

a first and a second force transmission bar respectively pivotally connected to the first and second arms;

a link pivotally connected to the first and second transmission bars at distinct pivot points;

a single actuator pivotally connected to the link at a third pivot point thereon for reciprocally moving the link from the first position in which the axis of the transmission bars are parallel to a second position in which the axis of the transmission bars intersect, the link being responsive to a force imposed in a predetermined direction by the actuator to simultaneously apply through the force transmission bars a force on each arm tending to displace the rolls away from the position occupied while the link is in the first position, the link being responsive to a second force directed oppositely to the first force to simultaneously apply to the force transmission bars a force on each arm tending to restore the rolls to the position occupied while the link is in the first position.

2. The improvement as claimed in claim 1 further comprising a second actuator connected to one of the arms at a point distinct from the pivot point thereof for applying an overdriving pressurized force to the rolls when the link is in the first position.

3. The improvement as claimed in claim 2 further comprising a stop member secured to the fixed member and adapted to abut against the control arm to limit the magnitude of the force imposed thereon by the second actuator.

* * * * *